United States Patent
Juengling

(10) Patent No.: US 7,993,988 B2
(45) Date of Patent: Aug. 9, 2011

(54) TECHNIQUES FOR FABRICATING A NON-PLANAR TRANSISTOR

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/538,680

(22) Filed: Aug. 10, 2009

(65) Prior Publication Data

US 2009/0298246 A1    Dec. 3, 2009

Related U.S. Application Data

(62) Division of application No. 11/433,533, filed on May 12, 2006, now Pat. No. 7,573,108.

(51) Int. Cl.
*H01L 21/00* (2006.01)
*H01L 21/8238* (2006.01)

(52) U.S. Cl. ........ 438/149; 438/156; 438/212; 257/302; 257/329; 257/E21.422

(58) Field of Classification Search ........... 438/149, 438/212, 156; 257/302, 308, 329, 401, E21.422
See application file for complete search history.

(56) References Cited

U.S. PATENT DOCUMENTS

| | | | | |
|---|---|---|---|---|
| 6,090,685 A * | 7/2000 | Gonzales et al. | ............ | 438/425 |
| 6,635,909 B2 * | 10/2003 | Clark et al. | ............ | 257/192 |
| 6,767,793 B2 * | 7/2004 | Clark et al. | ............ | 438/286 |
| 7,767,100 B2 * | 8/2010 | Fehlhaber et al. | ............ | 216/11 |
| 2005/0077553 A1 * | 4/2005 | Kim et al. | ............ | 257/288 |
| 2005/0093067 A1 | 5/2005 | Yeo et al. | | |
| 2007/0076477 A1 | 4/2007 | Hwang et al. | | |

FOREIGN PATENT DOCUMENTS

WO    2004038770    5/2004

OTHER PUBLICATIONS

T. Park, et al.: "Fabrication of Body-Tied FinFETs (Oega MOSFETs) Using Bulk Si Wafers"; 2003 Symposium on VLSI Technology Digest of Technical Papers; Jun. 2003, 2 pages.
R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.

* cited by examiner

*Primary Examiner* — Hsien-ming Lee
(74) *Attorney, Agent, or Firm* — Fletcher Yoder

(57) ABSTRACT

Methods for fabricating a non-planar transistor. Fin field effect transistors (finFETs) are often built around a fin (e.g., a tall, thin semiconductive member). During manufacturing, a fin may encounter various mechanical stresses, e.g., inertial forces during movement of the substrate and fluid forces during cleaning steps. If the forces on the fin are too large, the fin may fracture and possibly render a transistor inoperative. Supporting one side of a fin before forming the second side of a fin creates stability in the fin structure, thereby counteracting many of the mechanical stresses incurred during manufacturing.

27 Claims, 7 Drawing Sheets

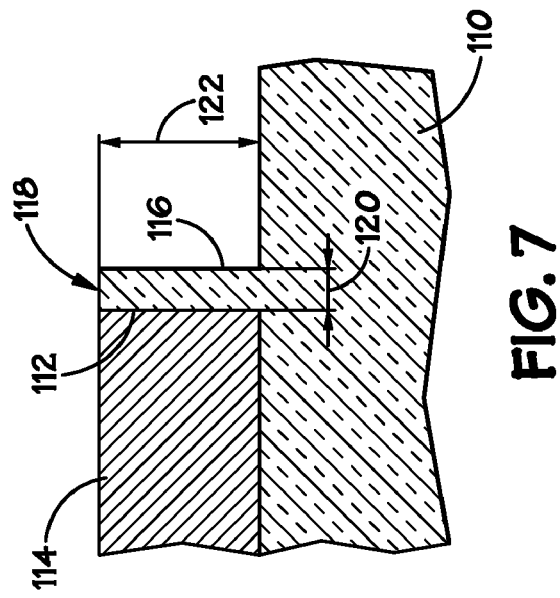
FIG. 7
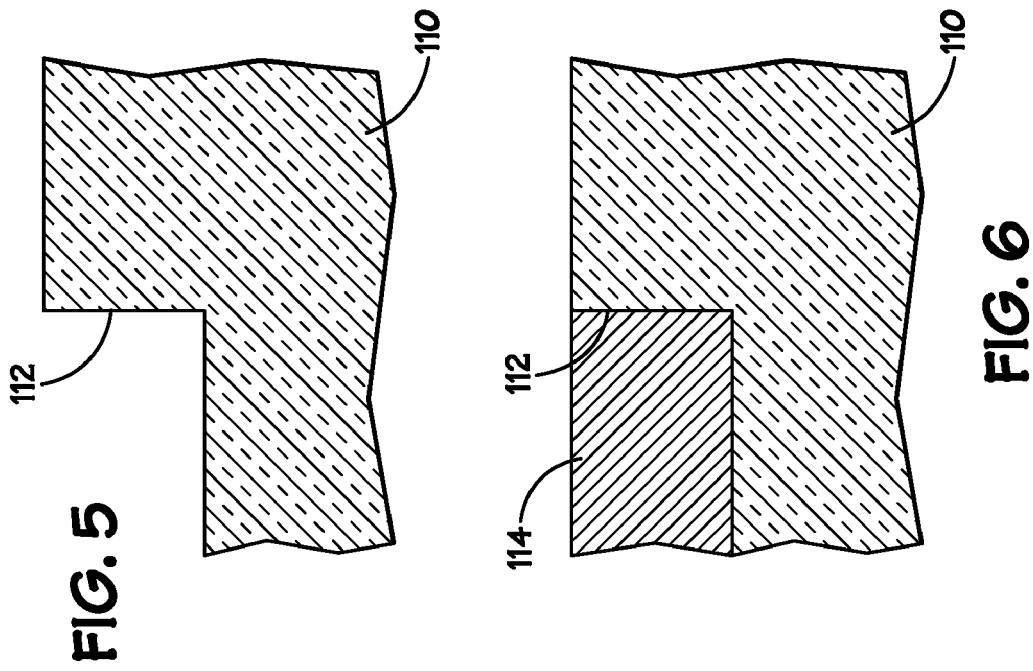
FIG. 5
FIG. 6

# TECHNIQUES FOR FABRICATING A NON-PLANAR TRANSISTOR

CROSS-REFERENCE TO RELATED APPLICATION

This application is a divisional of U.S. patent application Ser. No. 11/433,533, now U.S. Pat. No. 7,573,108, filed on May 12, 2006.

BACKGROUND OF THE INVENTION

1. Field of the Invention

The present invention relates generally to techniques for fabrication of electronic devices, and, more specifically, fabrication of non-planar transistors.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

High aspect ratio fins typically are desirable but challenging to construct. Generally, high aspect ratio finFETS can be integrated into a small area of the substrate, thereby potentially reducing manufacturing costs on a per-transistor basis. Unfortunately, manufacturing fins with a high aspect ratio may present difficulties. During manufacturing, a fin may encounter various mechanical stresses, e.g., inertial forces during movement of the substrate and fluid forces during cleaning steps. If the forces on the fin are too large, the fin may fracture and possibly render a transistor inoperative. High aspect ratio fins may be particularly susceptible to fracturing during manufacture because their height may concentrate larger internal stresses in their relatively narrow base.

BRIEF DESCRIPTION OF THE DRAWINGS

Advantages of the invention may become apparent upon reading the following detailed description and upon reference to the drawings, in which:

FIGS. 5-7 are cross-sectional views further illustrating the manufacturing process depicted by FIG. 4 in accordance with an embodiment of the present technique;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently discussed embodiments may facilitate the manufacture of high aspect ratio structures. As is described in detail below, in some embodiments, a first wall of a fin may be formed and buttressed before the second wall of the fin is formed. By supporting at least one wall of the fin during portions of the manufacturing process, some of these embodiments may advantageously prevent fracturing of very thin and/or high aspect ratio fins. The following discussion describes exemplary devices and process flows in accordance with embodiments of the present technique. Prior to addressing these embodiments from the device and process flow perspective, exemplary systems in accordance with embodiments of the present technique are described.

Figure 1:
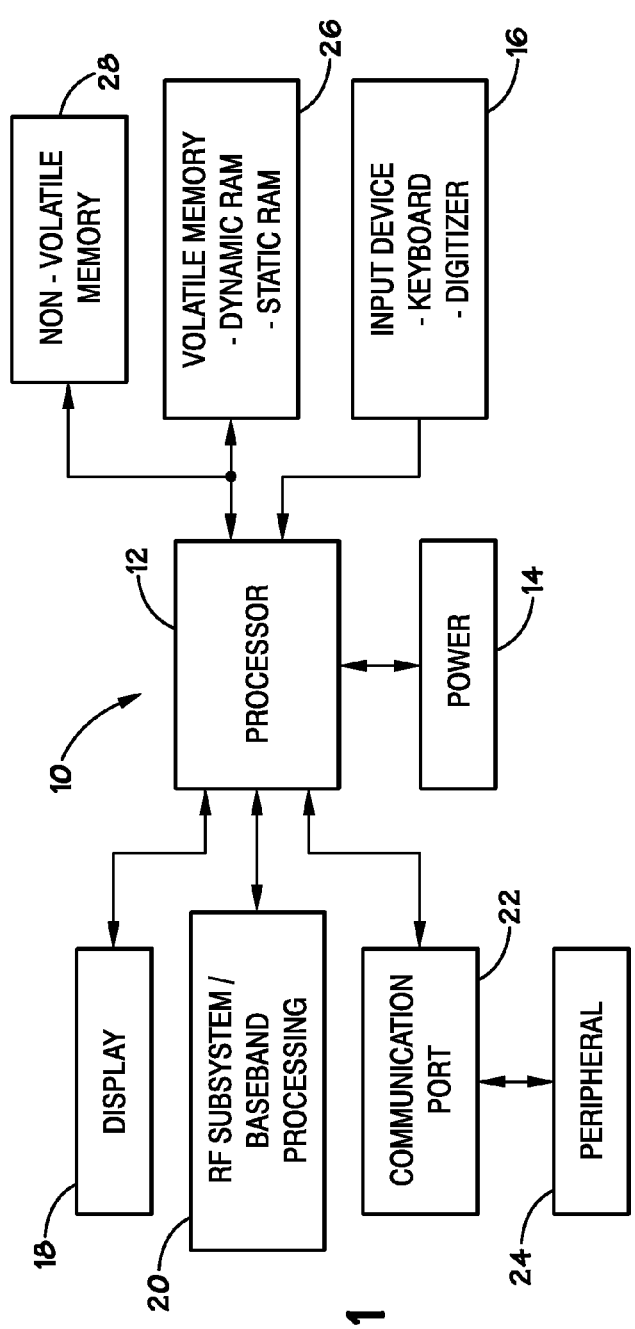
FIG. 1 illustrates a block diagram of an exemplary processor-based system in accordance with an embodiment of the present technique.

Turning to the figures, FIG. 1 depicts an exemplary processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. The processor 12 and other subcomponents of the system 10 may include structures manufactured in accordance with embodiments of the present technique, as is subsequently explained.

The system 10 typically includes a power supply 14. For instance, if the system 10 is a portable system, the power supply 14 may advantageously include a fuel cell, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory 26. The size of the ROM is typically selected to be just large enough to store any necessary operating system, application programs, and fixed data. Additionally, the non-volatile memory 28 may include a high capacity memory such as a tape or disk drive memory. As is explained in greater detail below, the non-volatile memory 28, as another example, may also include electronic devices manufactured in accordance with embodiments of the present technique.

Figure 2:
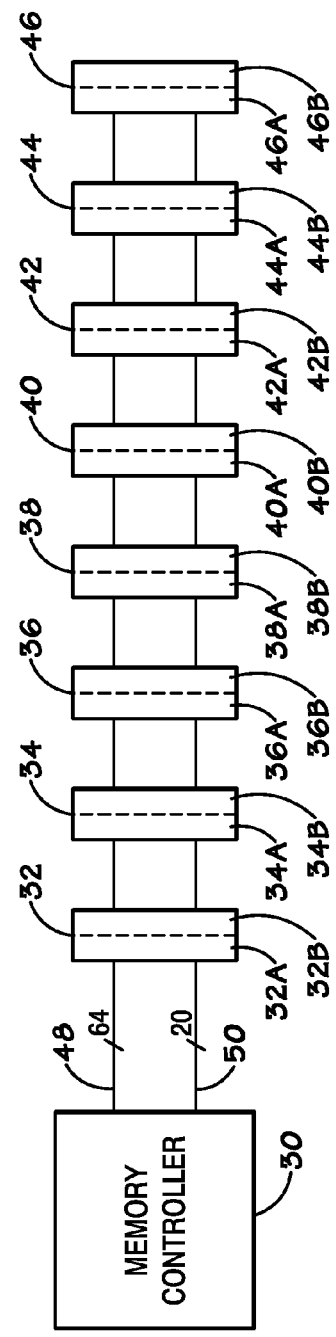
FIG. 2 illustrates an exemplary memory sub-system in accordance with an embodiment of the present technique.

FIG. 2 generally illustrates a block diagram of a portion of a memory sub-system, such as the volatile memory 26. A memory controller 30 is generally provided to facilitate access to storage devices in the volatile memory 26. The memory controller 30 may receive requests to access the storage devices via one or more processors, such as the processor 12, via peripheral devices, such as the peripheral device 24, and/or via other systems (not shown). The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIG. 3. As described further below, each DIMM has a number of memory devices on each side of the module. Each side of the module may be referred to as a "rank." Accordingly, each exemplary slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses, or transmission lines, each coupled from the memory controller 30 to a memory device. In one embodiment of the volatile memory 26, the memory data bus 48 may include 64 individual data buses. Further, the memory data bus 48 may include one or more individual buses to each memory rank 32A/B-46A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
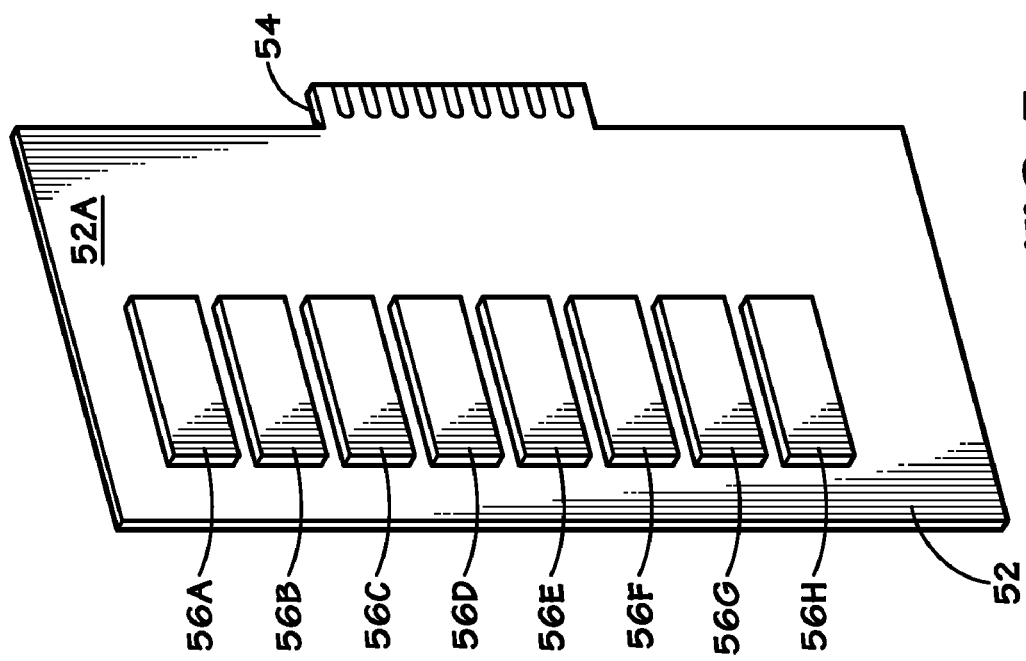
FIG. 3 illustrates an exemplary memory module in accordance with an embodiment of the present technique.

FIG. 3 illustrates exemplary memory module 52, such as a DIMM, that may be inserted into one of the memory slots 32-46 (FIG. 2). In the present exemplary view, one side of the memory module 52 is illustrated, and generally designated as the rank 52A. As previously discussed, the memory module 52 may include two ranks 52A and 52B. The rank 52A includes a plurality of memory devices 56A-56H, such as dynamic random access memory (DRAM) devices, which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second ranks). The embodiment of FIG. 3 may be employed in accordance with various standards. For instance, the memory module 52 may be employed in a single data rate (SDR), fully buffered (FB)-DIMM, double data rate (DDR), and double data rate 2 (DDR2) system 10.

The memory devices 56A-56H may each include an array of cells (not shown) that each include a transistor and a capacitor or some other memory element. In certain embodiments, at least a portion of the cells may be manufactured in accordance with embodiments of the present techniques. For example, one or more cells may include a high aspect ratio finFET and a memory element, such as a capacitor.

Figure 4:
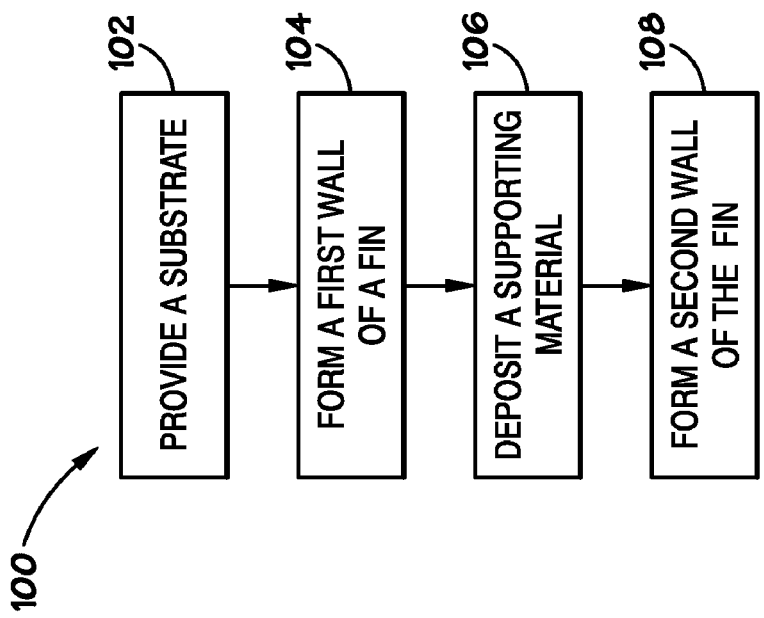
FIG. 4 is a flow chart depicting an exemplary manufacturing process in accordance with an embodiment of the present technique.

FIG. 4 is a flowchart illustrating an exemplary manufacturing process 100 that may be used to manufacture high aspect ratio structures, among other things, in accordance with embodiments of the present technique. Specifically, execution of the exemplary exemplary manufacturing process 100, in some embodiments, may result in the formation of a fin, such as those often used to construct finFETs or other forms of two or three-dimensional transistors.

With reference to FIGS. 4 and 5, the exemplary manufacturing process 100 begins with providing a substrate 110, as depicted by block 102 in FIG. 4, and forming a first wall 112 of what will become a fin, as depicted by block 104 in FIG. 4. The substrate 110 may include semiconductive materials such as single crystalline or poly crystalline silicon, gallium arsenide, indium phosphide, or other materials with semiconductor properties. Alternately, or additionally, the substrate 110 may include a non-semiconductor surface on which an electronic device may be constructed such as a plastic or ceramic work surface, for example. The substrate 110 may be in the form of a whole wafer, a portion of a diced wafer, or a portion of a diced wafer in a packaged electronic device, for instance.

The first wall 112 may be formed my employing any one of a variety of processes. For example, the substrate 110 may be patterned with a masking layer, such as a hard mask or photoresist (not shown), and the first wall may be anisotropically or isotropically wet or dry etched in or on the substrate 110. The masking layer may be removed from the substrate after formation of the first wall 112, or it may be left on the substrate 110 to facilitate the subsequent formation of various self-aligned and/or sub-photolithographic features, for example. The first wall 112 may be generally perpendicular to the substrate 110 and generally planar. Alternatively, the first wall 112 may be sloped relative to the substrate 110 and/or have one or more curvatures. In some embodiments, the first wall has a generally constant profile along a substantial portion of its length, such as through one, two, or five or more transistor lengths. (As used herein, the term "transistor length" refers to the magnitude of the largest horizontal dimension of the active area of the smallest transistor in an electronic device.)

With reference to FIGS. 4 and 6, the exemplary manufacturing process 100 may include depositing a supporting material 114, as depicted by block 106 in FIG. 4. The supporting material 114 may include dielectric materials, conductive materials, and/or semiconductive materials, for example. The supporting material 114 may be deposited or grown on the substrate 110 or on some intervening layer, such as a gate, liner, and/or barrier material, for instance. The supporting material may cover all or a portion of the first wall 112, and, in some embodiments, the supporting material 112 may extend above and/or higher than the first wall 112. After deposition of the supporting material 114, various steps may be employed to shape the supporting material 114, or the supporting material 114 may remain as deposited. For example, the supporting material 114 may be etched or polished back to the top of the masking layer or the substrate 110, or the supporting material 114 may be spacer etched to form a spacer adjacent the first wall 112. During at least some subsequent steps, in some embodiments, the supporting material 114 may limit strain near the first wall 112 when it is subject to mechanical forces.

Next in the exemplary manufacturing process 100, a second wall 116 may be formed in or on the substrate 110, as depicted by block 108 in FIG. 4 and FIG. 7. The second wall 116 may be patterned with, inter alia, photolithographic techniques, sub-photolithographic techniques, and/or self-aligned-structure manufacturing techniques. For instance, the second wall 116 may be self-aligned with the first wall 112 by isotropically etching a masking layer used to form the first wall 112 or spacer etching a second masking layer over a protruding supporting material 114.

Collectively, the first wall 112 and the second wall 116 may define a fin 118. The fin 118 may have a fin width 120, a fin height 122, and one or more edges (not shown) that may be generally perpendicular to the first wall 112. The fin width may be less than 1000 Å, 900 Å, 800 Å, 700 Å, 600 Å, 500 Å, 400 Å, 300 Å, 200 Å, or 100 Å, for example. The ratio of fin height 122 to fin width 120 (i.e., the "aspect ratio") may be greater than 20 to 1, 18 to 1, 16 to 1, 14 to 1, 12 to 1, 10 to 1, 9 to 1, 8 to 1, 7 to 1, 6 to 1, 5 to 1, 4 to 1, 3 to 1, or 2 to 1, for instance. The fin 118 may have a generally rectangular cross-section, a cross-section, a generally trapezoidal cross-section, or a cross-section with some other shape. In some embodiments, the fin 118 has a generally constant cross-sectional profile along at least a portion of its length, such as through one, two, five, or more transistor lengths. The fin 118 may have a generally constant width 120 along its length, or the fin 118 may vary in width 120 along its length. Similarly, the fin 118 may have a generally constant height 122 along its length, or the fin 118 may vary in height 122 along its length. The fin 118 may be used to form, inter alia, a finFET transistor, as is described in the following exemplary embodiment.

Advantageously, the fin 118 may be resistant to fracturing during the manufacture of an electronic device. By etching one side of the fin 118 at a time and supporting that side before etching the other side, embodiments of the exemplary manufacturing process 100 may be employed to produce thin fins 118 and/or fins with a high aspect ratio.

Figure 8:
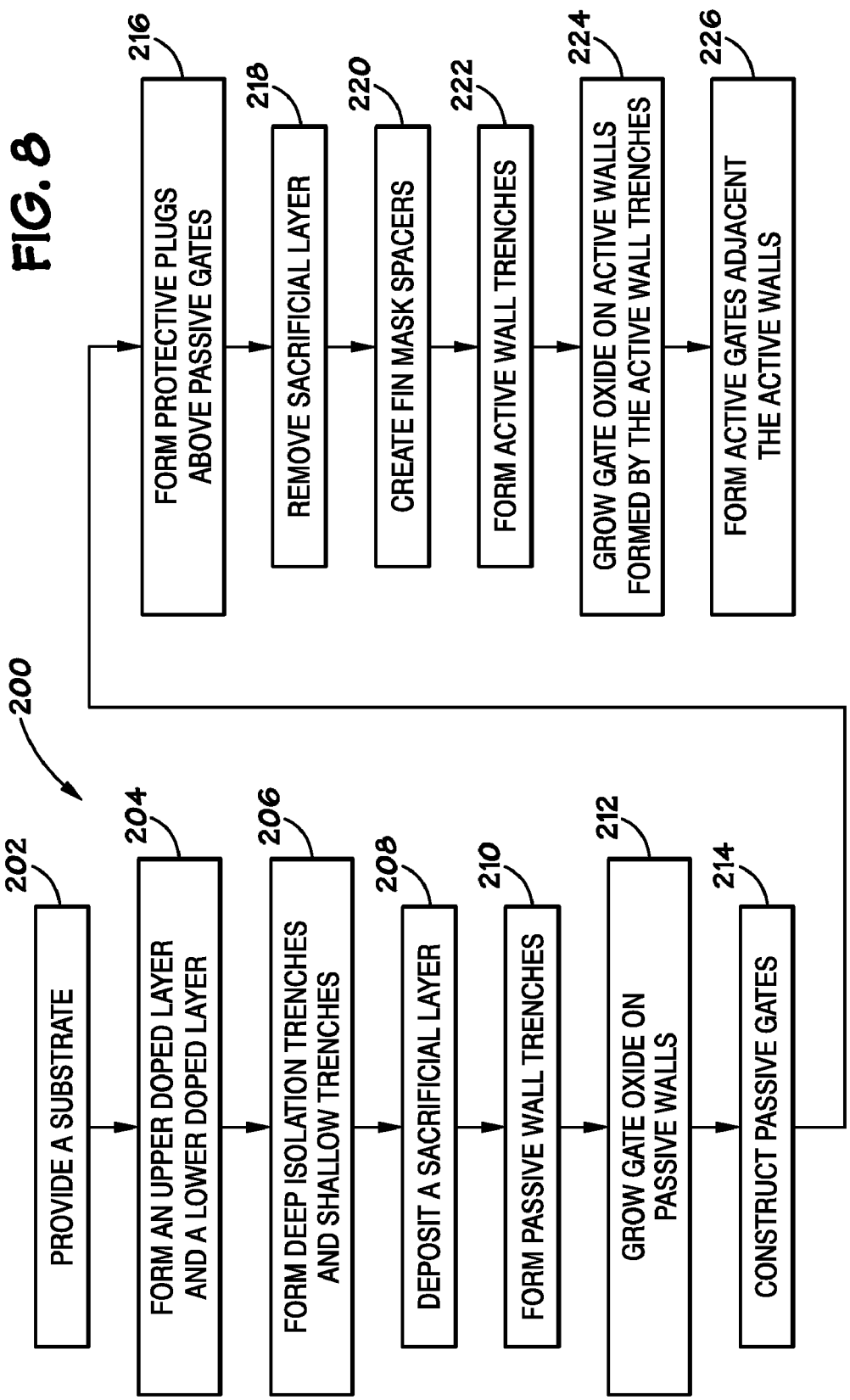
FIG. 8 is a flow chart depicting another exemplary manufacturing process in accordance with an embodiment of the present technique.

FIG. 8 generally depicts another exemplary manufacturing process 200. In some embodiments, the exemplary manufacturing process 200 may form a finFET transistor with a fin. As is explained below, in certain embodiments, one side of the fin may be supported during certain processing steps that might otherwise tend to fracture the fin. Supporting one side of the fin may facilitate the formation of thin fins and/or high aspect ratio fins.

Figure 9:
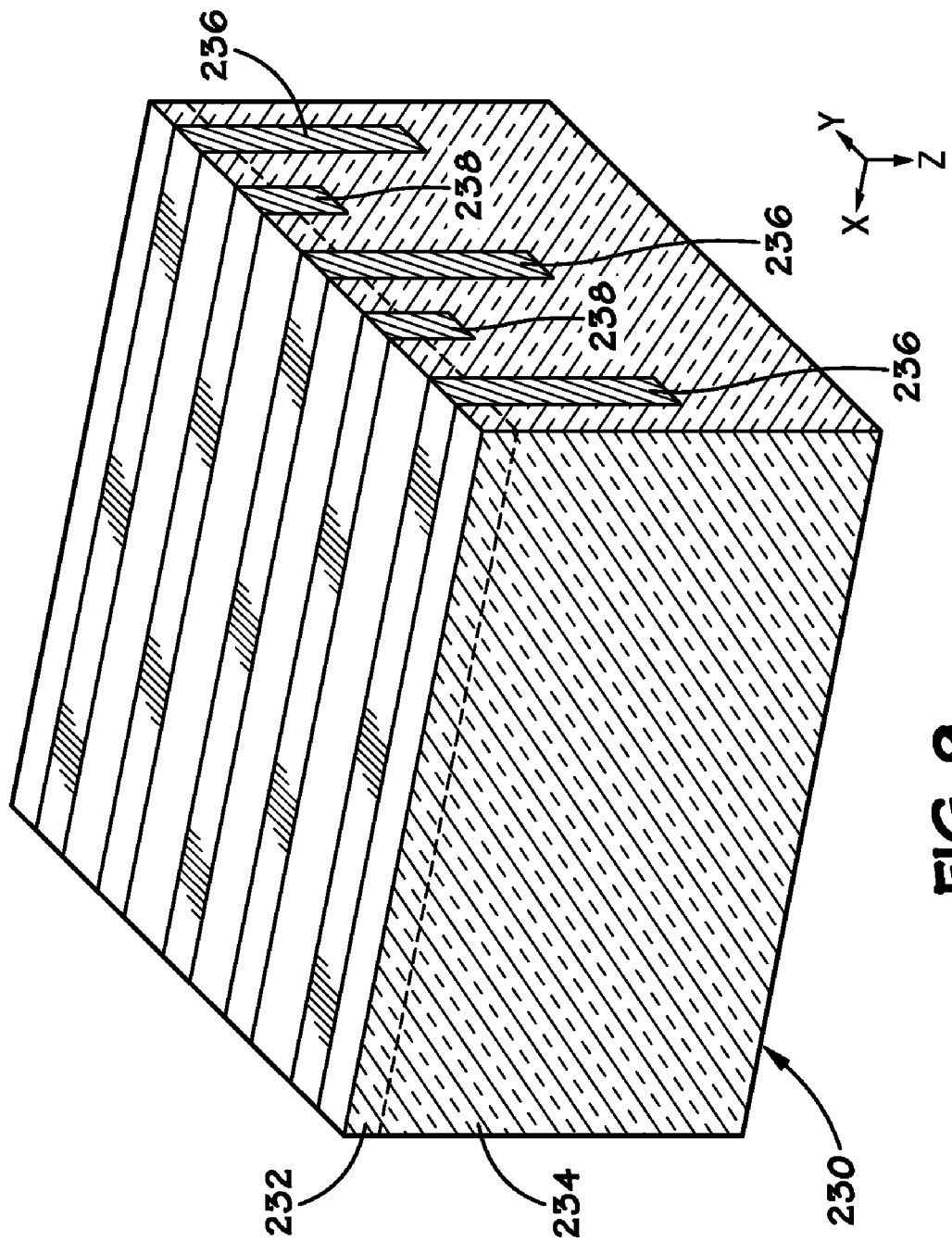
FIGS. 9-13 are perspective views further illustrating the manufacturing process of FIG. 8 in accordance with an embodiment of the present technique.

With reference to FIGS. 8 and 9, the exemplary manufacturing process 200 may begin with providing a substrate 230, as depicted by block 202 in FIG. 8. The substrate 230 may include any of the materials discussed in reference to the substrate 110 in FIG. 5. Additionally, the substrate 230 may include an upper doped layer 232 and a lower doped layer 234 formed in the step depicted by block 204 in FIG. 8. The upper doped layer 232 and the lower doped layer 234 may be differently doped. For example, the upper doped layer 232 may be an N+ material and the lower doped layer 234 may be a P– material. The depth of the upper doped layer 232 may be generally uniform over a substantial portion of portion of the substrate 230, such as throughout a substantial portion of an array area of a memory device, for example. The upper doped layer 232 and lower doped layer 234 may be formed by implanting or diffusing dopant materials. Alternatively, or additionally, one or both of these layers 232 and/or 234 may be doped during growth or deposition of all or part of the substrate 230, such as during epitaxial deposition of a semiconductive material or during growth of a semiconductive ingot from which wafers may be cut. It should be noted that the step depicted by block 204, like many of the steps in the manufacturing process 200, may be performed in a different sequence than that depicted by FIG. 8. As is explained below, the upper doped layer 232 may form a source and a drain of a transistor, and the lower doped layer 234 may form a channel of a transistor.

Deep isolation trenches 236 and shallow trenches 238 may be formed in the substrate 230, as depicted by block 206 in FIG. 8. These trenches 236 and 238 may generally extend in the x-direction, as indicated in FIG. 9. One or more shallow trenches 238 may be interposed between pairs of the deep isolation trenches 236. In some embodiments, the shallow trenches 238 may be deeper than the upper doped layer 232 to separate subsequently formed sources and drains. Additionally, the deep isolation trenches 236 may be deeper than the shallow trenches 238 to isolate subsequently formed transistors. The deep isolation trenches 236 and/or shallow trenches 238 may have a generally rectangular or trapezoidal cross-section, and, in some embodiments, their cross-section may be generally uniform through some distance in the x-direction, for example through a distance larger than one, two, five, or more transistor lengths. The deep isolation trenches 236 and shallow trenches 238 may be partially or entirely filled with various dielectric materials, such as high density plasma (HDP) oxide, for instance, to electrically isolate features. Additionally, the deep isolation trenches 236 and/or shallow trenches 238 may include various liner materials, such as silicon nitride for example, to relieve film stresses, improve adhesion, and/or function as a barrier material.

Figure 10:
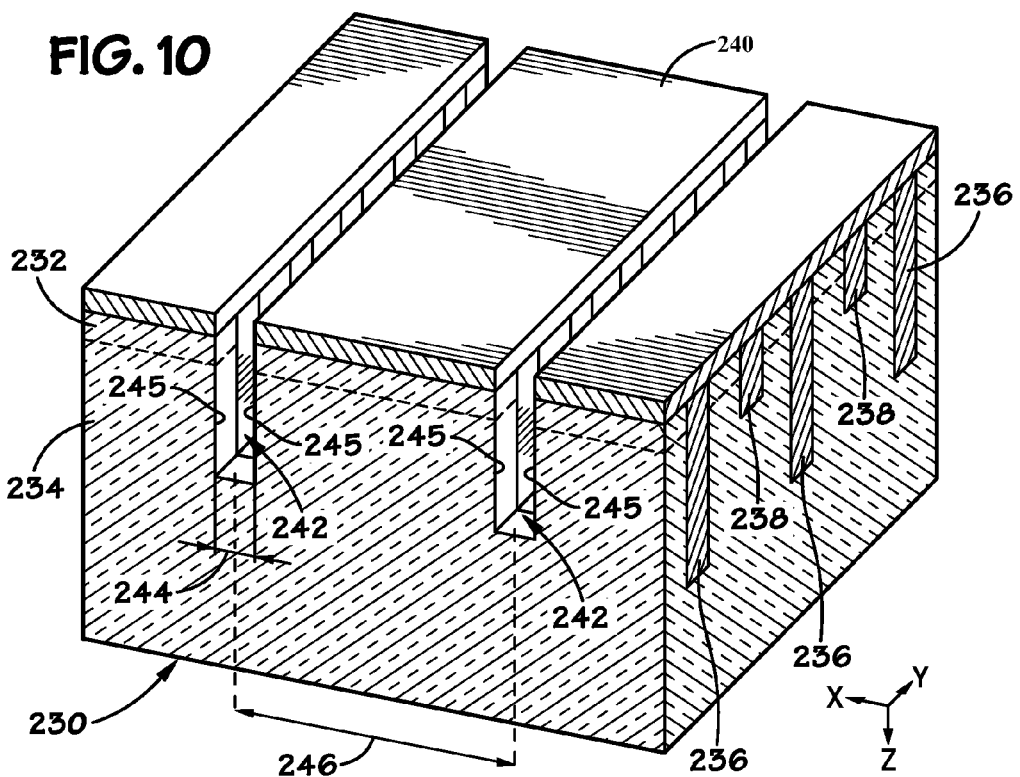

With reference to FIGS. 8 and 10, the exemplary manufacturing process 200 may include depositing or growing a sacrificial layer 240, as depicted by block 208 in FIG. 8. The sacrificial layer 240 may include one or more films with a combined thickness between 1450 Å and 1550 Å, 1350 Å and 1650 Å, 1250 Å and 1750 Å, 1150 Å and 1850 Å, 1050 Å and 1950 Å, 850 Å and 2150 Å, or 550 Å and 2450 Å. In some embodiments, the sacrificial layer 240 may be an oxide film with a thickness of approximately 1500 Å. Of course, other materials and/or thicknesses of materials may function as the sacrificial layer 240 in accordance with various embodiments of the present technique that include a sacrificial layer 240.

Next in the exemplary manufacturing process 200, passive wall trenches 242 may be formed, as depicted by block 210 in FIG. 8. As is discussed below, the term "passive" generally refers to structures related to components that, in certain embodiments, do not necessarily change voltage when activating a transistor. For instance, some of the subsequently discussed transistors include a fin with a passive side and an active side. The passive wall trenches 242 may be masked with photoresist and/or by forming a hard mask from the sacrificial layer 240. Various sub-photolithographic techniques may be used to pattern the passive wall trenches 242, such as reflowing patterned photoresist and/or forming sidewall spacers on a hard mask constructed from the sacrificial layer 240, for example. Once a mask is formed, the passive wall trenches 242 may be etched from the substrate 230 with, for example, an anisotropic dry etch. The passive wall trenches 242 may extend in the y-direction, generally perpendicular to the deep isolation trenches 236 and shallow trenches 238. Indeed, in the present embodiment, the passive wall trenches 242 intersect a plurality of the deep isolation trenches 236 and shallow trenches 238. The passive wall trenches 242 may be generally parallel to each other and of generally uniform depth and width. In some embodiments, the width 244 of the passive wall trenches 242 is approximately F/2, where F is the wavelength of light used to pattern the passive wall trenches 242. However, in other embodiments, the width 244 may be less than F/2 or greater than F/2. The passive wall trenches 242 may have a pitch 246 of approximately 4F, greater than 4F, or less than 4F. In a cross-section normal to the y-direction the passive In a cross-section normal to the y-direction the passive wall trenches may be generally rectangular or trapezoidal. Alternatively, the passive wall trenches may have a cross-section with some other shape. In some embodiments, the cross-section is generally constant through some distance in the y-direction, such as through one, two, five, or more transistor lengths. The passive wall trenches 242 may be deeper than the shallow trenches 236. In the present embodiment, the sidewalls of the passive wall trenches 242 form passive walls 245, which, as is subsequently discussed, may each form a first wall or side of a fin.

Figure 11:
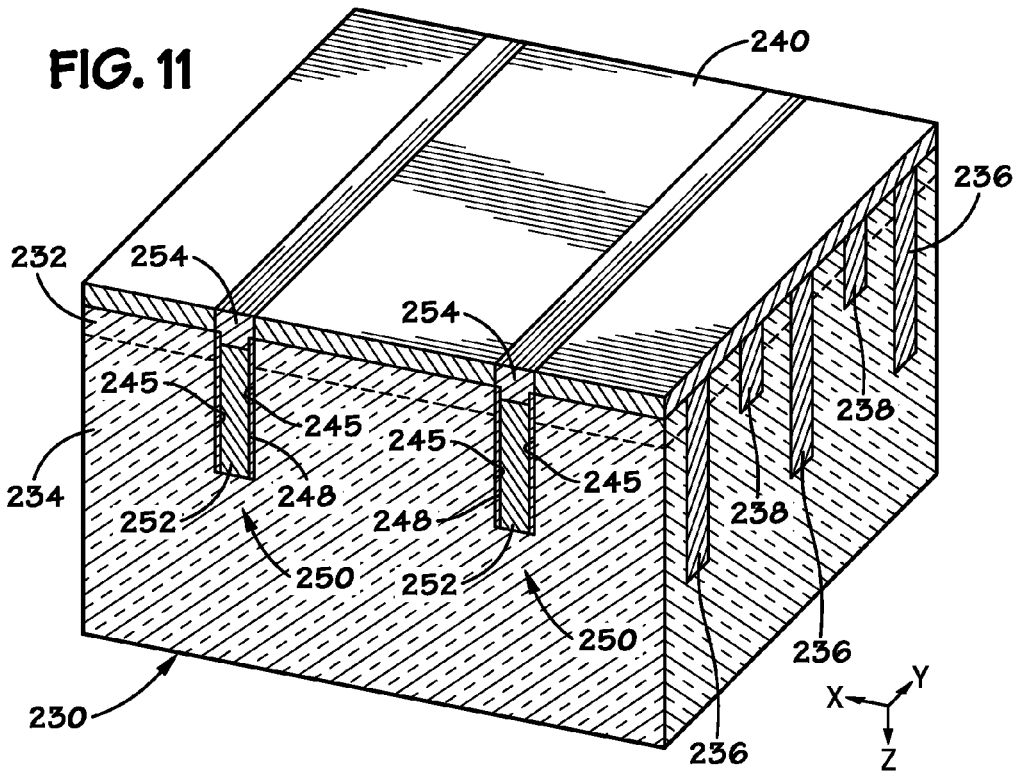

With reference to FIGS. 8 and 11, the exemplary manufacturing process 200 may include growing or depositing gate oxide 248 on the passive walls 245, as depicted by block 212 of FIG. 8. The gate oxide 248 may be spacer etched to remove the gate oxide 248 from the bottom of the passive wall trenches 242. Alternatively, the gate oxide 248 may be left in the bottom of the passive wall trenches 242, thereby, in some embodiments, isolating the subsequently formed passive gates from the substrate 230. It is important to note that gate oxide 248 is merely exemplary and that other materials may be used in its place, such as high dielectric constant materials like hafnium dioxide, zirconium dioxide, and titanium dioxide, for example.

Next, passive gates 250 may be constructed, as depicted by block 214 of FIG. 8. In certain embodiments, the passive gates 250 may be disposed at least partially or entirely in the passive wall trenches 242. Passive gates 250 may include a conductive material 252, such as a p-plus doped polysilicon, doped polysilicon, conductive metals, or other appropriate work function material, for example. The conductive material 252 may be deposited and etched back, thereby, in some embodiments, recessing the conductive material 252 below the surface of the substrate 230 and/or the sacrificial layer 240. As is explained further below, in some embodiments, the passive gates 250 may support one side or wall of fins during subsequent processing steps. Additionally, the passive gates 250 may be used to manage the flow of current through fins during operation. Indeed, in certain embodiments, a number of the passive gates 250 may support one wall of a fin on each side of the passive gate 250. In other words, the passive gates 250 may support two fins symmetrically disposed about the passive gates 250 in these embodiments.

Protective plugs 254 may be formed above the passive gates 250, as depicted by block 216 in FIG. 8. The protective plugs 254 may include silicon nitride and/or other appropriate materials. The protective plugs 254 may be deposited and etched or polished back until they are generally planar with, or recessed below, the surface of the sacrificial layer 240. As discussed below, in some embodiments, the protective plugs 254 may act as a reference structure for forming self-aligned fins on either side of the protective plugs 254.

Figure 12:
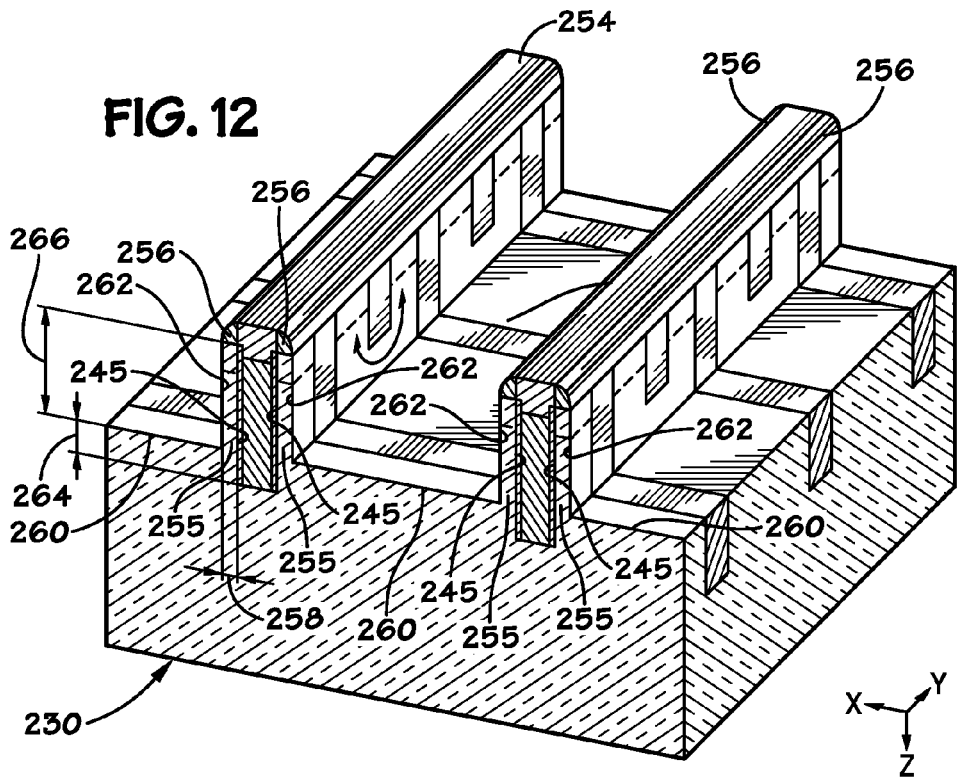

Turning to FIG. 12, next in the exemplary manufacturing process 200, fins 255 may be formed. To pattern the fins 255, various sub-photolithographic patterning techniques and self-alignment techniques may be employed. For instance, in the present embodiment, both sub-photolithographic patterning techniques and self-alignment techniques may be used to pattern the fins 254. Advantageously, because the passive wall trenches 242 are filled with the conductive material 252 before forming the second side of the fins 255, the fins 255 may be buttressed during later manufacturing steps and resistant to fracturing, as is explained below.

First, the sacrificial layer 240 may be removed, as depicted by block 218 in FIG. 8, thereby exposing the sides of the protective plugs 254. At this stage, the protective plugs 254 may protrude above the surface of the substrate 230.

Subsequently, fin mask spacers 256 may be created, as depicted by block 220 in FIG. 8. The fin mask spacers 256 may include oxide and/or other appropriate materials of a thickness selected to generally determine the width 258 of the underlying fins 255. To shape the fin mask spacers 256, their components material or materials may be conformally deposited over the protective plugs 254 and spacer etched back with, for example, an anisotropic etch. After the spacer etch, the width of the fin mask spacers 256 may generally determine the fin width 258. In some embodiments, the fin mask spacers 256 may facilitate the formation of fins 255 with a fin width 258 smaller than the resolution limit of the equipment used to pattern other features on the substrate 230. For instance, the fin width 258 may be smaller than the resolution limit of a 193 nanometer lithography process or a 157 nanometer lithography process, either of which may include immersion lithography steps. Further, because the fin mask spacers 256 may be formed on the sides of the protective plugs 254, the fin mask spacers 256 may be self-aligned with the passive gates 250 of the current embodiment. Of course, other self aligned, sub-photolithographic, direct patterning, or direct alignment techniques may be employed in accordance with embodiments of the present technique.

Finally, using the fin mask spacers 256 as a self-aligned hard mask, active wall trenches 260 may be anisotropically etched or otherwise formed, as depicted by block 222 in FIG. 8. As described below, the term "active" generally refers to structures relating to components that, in some embodiments, are selectively energized to turn on the transistor. The active wall trenches 260 may be formed non-concurrently with the passive wall trenches 242, e.g., after the passive wall trenches 242 and, in some embodiments, after the passive gate 250.

Active wall trenches 260 may extend in the y-direction, generally parallel to, and interposed between, the passive wall trenches 242 (now at least partially filled with the conductive material 252 to create passive gate 250). The sidewalls of the active wall trenches 260 may form active walls or sides 262 of the fins 255. The depth of the active wall trenches 260 may be selected so that the difference in depth 264 from the bottom of the passive wall trenches 242 is greater than zero, generally zero, or less than zero. In other words, the active wall trenches 260 may be deeper than the passive wall trenches 242, as deep as the passive wall trenches 242, or less deep than the passive wall trenches 242. The fin width 258 may be less than 900 Å, 800 Å, 700 Å, 600 Å, 500 Å, 400 Å, 350 Å, 300 Å, 250 Å, 200 Å, 150 Å, or 100 Å, for instance. The ratio of fin height 266 to fin width 258 (i.e., the aspect ratio of the fins 255) may be greater than 20 to 1, 15 to 1, 10 to 1, 9 to 1, 8 to 1, 7 to 1, 6 to 1, 5 to 1, 4 to 1, or 3 to 1, for example. The fin height 266 may be deeper than the shallow trench 238 in some embodiments.

The fins 255 may have a generally uniform cross-section, such as a generally rectangular cross-section, a generally trapezoidal cross-section, or other cross-sectional shape, extending along at least a substantial portion their length in the y-direction, e.g., through one, two, five, or more transistor lengths. Of course, in some embodiments, the fin cross-section may vary along the length of the fin in the y-direction. For instance, the fin width 258 may vary or the fin height 266 may vary. The fin width 258 may be generally uniform along the fin height 266, in the z-direction, or the fin width 258 may narrow or expand along the fin height 266. In some embodiments, the active wall 262 and passive wall 245 may generally slope or curve toward or away from each other (i.e., the fin width 258 may taper) along the fin height 266, in the z-direction.

The fins 255 may extend generally perpendicularly to the deep isolation trenches 236 and the shallow trenches 238, in the y-direction. In the present embodiment, the fins 255 rise generally perpendicularly from the substrate 230, in the z-direction. Of course, in other embodiments, the fins 255 may not be generally orthogonal to the deep isolation trenches 236 and/or the substrate 230. In the present embodiment, the active walls 262 may be generally parallel to, and located on opposing sides of the fins 255 from the passive walls 245.

During portions of the exemplary manufacturing process 200, the passive gates 250 may mechanically support the fins 255. For example, in some embodiments, strain within the fins 255 during movement and/or immersion in liquids may be limited due to the passive gates 250 constraining movement of the fins 255. As a result, very thin, high aspect ratio fins 255 may be manufactured in some embodiments. It should be noted, however, that the present technique is not limited to embodiments with passive gates, embodiments where the fins 255 are supported, or embodiments with thin, high aspect ratio fins.

Figure 13:
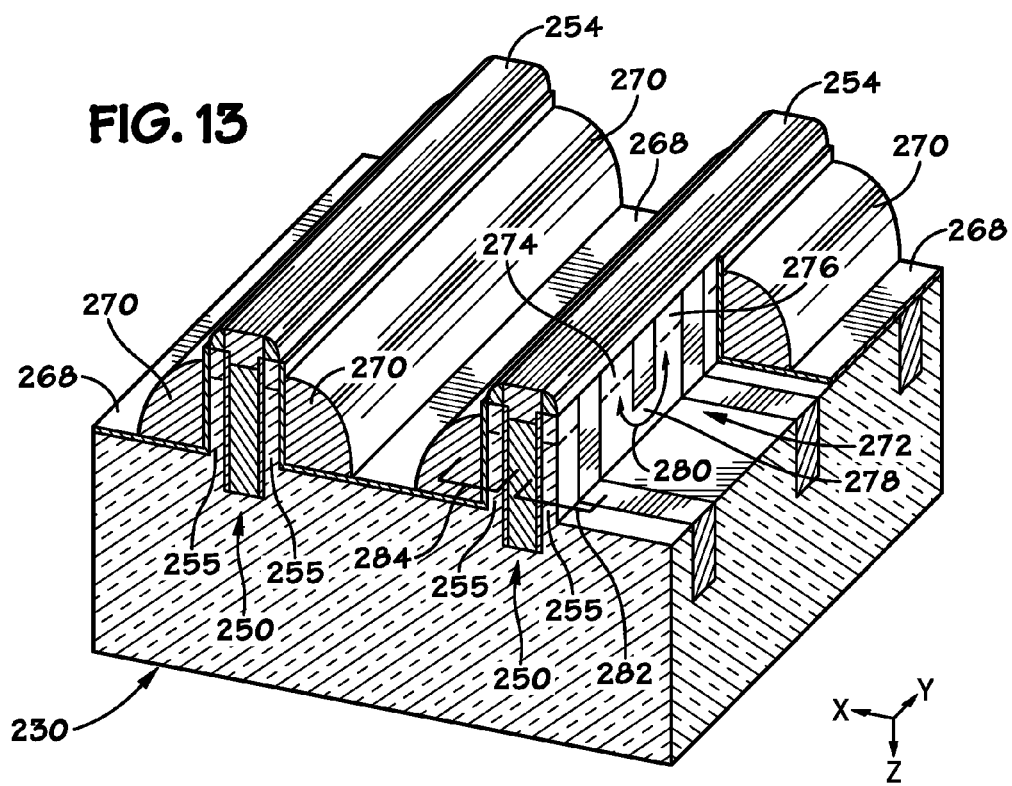

With reference to FIGS. 8 and 13, the exemplary manufacturing process 200 may include growing or depositing gate oxide 268 in the active trenches 260, as depicted by block 224 in FIG. 8, and forming active gates 270, as depicted by block 226 in FIG. 8. As an alternative to the gate oxide, other appropriate work function materials, such as those discussed above in reference to the gate oxide 248, may be employed. The active gates 270 may be formed by blanket depositing a conductive material, such as titanium nitride, doped polysilicon, or other conductive material, and spacer etching the material to form the active gates 270. The active gates may be disposed next to the active walls 262 and extend generally parallel to the fins 255, in the y-direction. The active gates may extend along a substantial portion of the fin 255 in the y-direction, such as through one, two, five, or more transistor lengths.

In certain embodiments, the fins 255 may form a portion of rows 282 and 284 of transistors 272, as depicted by the cutaway portion of FIG. 13. The rows 282 and 284 may be generally symmetrically disposed about the passive gates 250. Further, each row 282 and 284 may include a plurality of generally identical transistors 272 disposed at generally equidistant areas along the y-direction. Of course, in other embodiments, the transistors 272 in a row 282 or 284 may not be generally identical, e.g., n-type and p-type transistors or differently sized transistors, and/or the transistors 272 may not be regularly spaced along the row 282 or 284.

In the certain embodiments, adjacent transistors 272 in the X-direction may be connected in parallel with the active gate 270 and/or the passive gate 250. In the present embodiment, adjacent transistors 272 in rows 282 and 284 are connected in parallel with the passive gate 250. However, in some embodiments, an active gate 270 may span between rows, in the X-direction, or otherwise be connected. It should also be noted that while the passive gate 250 connects the transistors in rows 284 and 282 in parallel, in other embodiments, the passive gate 250 may not be shared between adjacent rows 284 and 282 of transistors 272. Further, in some embodiments, neither the active gate 270 nor the passive gate 250 is shared between adjacent rows of transistors 272, and, in other embodiments, both the passive gate 250 and active gate 270 are shared by adjacent rows of transistors 272.

The transistors 272 may include a source 274, a drain 276 and a channel 278. The source 274 and drain 276 of the present embodiment may be separated by a portion of the shallow trench 238, and the channel 278 may be at least partially below the shallow trench 238. Further, the source 274 and drain 276 may be located at least partially generally higher above the substrate 230 than the channel 278. In some embodiments, the source 274 and drain 276 may slightly overlap the channel 278 to facilitate conduction between the source 274, drain 276, and channel 278. However, as with many of the other features discussed herein, the present technique is not limited to embodiments with a source 274 and drain 276 above the channel 278 or to embodiments with a shallow trench 238 separating the source 274 and drain 276. It should also be noted that, while the present embodiment generally forms a finFET, other types of transistors and devices are within the scope of the present technique.

In operation, when the active gate 270 is energized above or below some threshold voltage, current 280 may flow between the source 274 and the drain 276 through the channel 278. The active gates 270 of some embodiments may activate one row of transistors 282 or 284 or the active gates 270 may be common to a group of rows 282 or 284. Additionally, the active gates 270 are electrically independent from the passive gates 250. That is, the active gates 270 have a different voltage than the passive gates 250 at certain times during operation. To activate a transistor 272, the active gates 270 may be switcheably coupled to a voltage source, for example through a switch such as another transistor.

In the present embodiment, the passive gate 250 is shared by a first row of transistors 282 and a second row of transistor 284. Passive gate 250 may be maintained at substrate voltage or negatively biased, thereby, in some embodiments, decreasing current leakage across the channel 278. The passive gate 250 may be fixedly electrically coupled coupled to the substrate 230 by, for example, the removal of gate oxide 248 from the bottom of the passive wall trenches 242. Alternatively, in other embodiments, the passive gate 250 may have a constant voltage that is different than the substrate 230 voltage, for instance less than the substrate 230 voltage. In these and other embodiments, the gate oxide 248 may be left in the bottom of the passive wall trenches 242, thereby, in some embodiments, isolating the passive gates 250 from the substrate 230. For instance, the passive gate 250 may be fixedly coupled to a voltage source at a negative or zero voltage. Thus, during operation, the transistor 272 may be activated from a single side, the active wall 262. The passive gate 250 remains at a zero or negative potential, even during operation of the associated transistor 272.

It should be noted that, in some embodiment in accordance with the present technique, the passive gate voltage 250 may vary. For example, the passive gate voltage 250 may be lowered in a sleep mode or a low power mode to reduce current leakage through the channel 278 and raised in an active mode to provide low threshold voltages for the active gates 270 and/or quick response times. In some embodiments, the roll of the active gate 270 may be partially or entirely filled by the structure identified as the passive gate 250 in the present embodiment. That is, the gate 250 may be active, and a voltage applied to the gate 250 may activate adjacent rows 284 and 282 of transistors 272. In these embodiments, the structure identified as the active gate 270 in the present embodiment may itself be either passive or active, dependent on the embodiment.

In some embodiments, the transistor 272 may be used to access a capacitor, a floating gate, or other volatile or non-volatile memory element. For example, a digit line may connect to the source 274, and a capacitor may connect to the drain 276, or vice versa. In this embodiment, active gate 270 may function as a word line. In operation, such an embodiment may access a memory element connected to the drain 276 by turning on the transistor 272. For instance, the active gate 270 may be connected to a voltage source and the digit line coupled to a sense amp, or vice versa. Alternatively, the transistor 272 may be employed in some other type of electronic device. For example, the transistor 272 may transistor 272 may be employed in a microprocessor, a digital signal processor, a programmable memory device, or an application specific integrated circuit, to name but a few.

Advantageously, the exemplary manufacturing process 200 may be used to create a manufacturable transistor 272 with high aspect ratio and/or thin fins 255. The passive gate 250 of the present embodiment may buttress the fins 255, thereby decreasing the likelihood of a thin fin fracturing during subsequent manufacturing steps. Further, the exemplary manufacturing process 200 may result in a transistor 272 that may be used to exercise precise control over the flow of current 280 through the channel 278. For instance, the passive gate 255 may provide an additional parameter that may be used to tune the response of the transistor 272 to the potential of the active gate 270. Thus, the exemplary manufacturing process 200 may be employed to produce tightly integrated and precisely controlled transistors 272.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a device, comprising:
   providing a substrate;
   forming a first wall of a fin;
   constructing a supporting structure adjacent the first wall; and
   forming a second wall of the fin after constructing the supporting structure;
   wherein the first wall is a passive wall, the supporting structure is a passive gate, and the second wall is an active wall.

2. The method of claim 1, wherein forming the first wall comprises patterning a trench in the substrate.

3. The method of claim 1, comprising etching isolation trenches, wherein a normal vector of the passive wall is generally parallel with the isolation trenches.

4. The method of claim 2, wherein patterning a trench comprises patterning a trench with a sub-photolithographic technique.

5. The method of claim 1, comprising forming an active gate adjacent the second wall of the fin.

6. The method of claim 5, wherein forming an active gate comprises forming an active gate that is electrically independent from the passive gate.

7. A method of fabricating a device, comprising:
   providing a substrate;
   forming a first wall of a fin;
   constructing a supporting structure adjacent the first wall; and
   forming a second wall of the fin after constructing the supporting structure;
   wherein the first wall is an active wall, the supporting structure is an active gate, and the second wall is a passive wall.

8. A method of fabricating a device, comprising:
   forming a first wall of a fin;
   forming a supporting material adjacent the first wall of the fin, wherein the supporting material is configured to provide support of the fin during fabrication; and
   forming a second wall of the fin after forming the supporting material;
   wherein the first wall is a passive wall, the supporting material is a passive gate, and the second wall is an active wall.

9. The method of claim 8, wherein the supporting material is dielectric material, conductive materials, or semiconductive materials.

10. The method of claim 8, comprising forming a transistor about the fin.

11. The method of claim 8, wherein the supporting material is shaped through etching or polishing.

12. A method of fabricating a transistor, comprising:
    providing a substrate;

forming a first side of a fin, the first side extending in a first direction;

constructing a supporting structure for the first side of the fin; and forming a second side of the fin after constructing the supporting structure, the second side generally extending in the first direction;

wherein forming a second side of the fin comprises forming active wall trenches on the second side of the fin.

13. The method of claim 12, wherein forming the first side of a fin comprises patterning a passive wall trench in the substrate.

14. The method of claim 13, wherein the supporting structure for the first side of the fin comprises forming a gate coupled to the first side.

15. The method of claim 14, wherein the gate coupled to the first side comprises passive gates formed by disposing conductive material at least partially in the passive wall trench.

16. The method of claim 15, wherein the passive wall trench forms walls on each side of the trench and the passive gates support walls on each side of the trench.

17. The method of claim 16, comprising etching isolation trenches in the substrate, wherein a normal vector of the passive wall trench is generally parallel with the isolation trenches.

18. The method of claim 13, wherein patterning a passive wall trench comprises patterning a trench with a sub-photolithographic technique.

19. The method of claim 12, comprising forming active gates by disposing a conductive material in the active wall trenches and spacer etching the conductive material in a gate shape.

20. A method of fabricating a transistor, comprising:
providing a substrate comprising an upper doped layer and a lower doped layer;
forming a first side of a fin, the first side extending in a first direction;
constructing a supporting structure for the first side of the fin; and
forming a second side of the fin after constructing the supporting structure, the second side generally extending in the first direction.

21. The method of claim 20, comprising forming an active gate adjacent the second side of the fin.

22. The method of claim 21, wherein forming an active gate comprises forming an active gate that is electrically independent from a passive gate formed on the first side of the fin.

23. A method of fabricating a transistor, comprising:
providing a substrate;
forming a first side of a fin, the first side extending in a first direction;
constructing a supporting structure for the first side of the fin; and
forming a second side of the fin after constructing the supporting structure, the second side generally extending in the first direction;
wherein the first side of the fin is an active wall, the supporting structure is an active gate, and the second side of the fin is a passive wall.

24. A method of fabricating a transistor, comprising:
providing a substrate;
forming a first side of a fin, the first side extending in a first direction;
constructing a supporting structure for the first side of the fin;
forming a second side of the fin after constructing the supporting structure, the second side generally extending in the first direction; and
fabricating a first gate adjacent the first side of the fin and fabricating a second gate adjacent the second side of the fin, wherein the fin is at least partially between the first gate and the second gate.

25. A method of fabricating a transistor, comprising:
providing a substrate;
forming a first side of a fin, the first side extending in a first direction;
constructing a supporting structure for the first side of the fin;
forming a second side of the fin after constructing the supporting structure, the second side generally extending in the first direction; and
forming a fin mask spacer, wherein forming a second side of the fin comprises etching the second side of the fin with the fin mask spacer masking the fin.

26. The method of claim 25, comprising:
depositing a supporting material next to the first side of the fin; and
forming a protective plug on the supporting material, wherein forming the fin mask spacer comprises forming the fin mask spacer next to the protective plug with a spacer etch.

27. The method of claim 26, wherein:
depositing a supporting material comprises depositing an electrically conductive supporting material;
forming a protective plug comprises forming a protective plug comprising silicon nitride; and
forming the fin mask spacer comprises forming a fin mask spacer comprising silicon nitride.

* * * * *